(12) United States Patent
Richter

(10) Patent No.: US 9,147,555 B2
(45) Date of Patent: Sep. 29, 2015

(54) ARC EXTINCTION ARRANGEMENT AND METHOD FOR EXTINGUISHING ARCS

(71) Applicant: HUETTINGER Elektronik GmbH + Co. KG, Freiburg (DE)

(72) Inventor: Ulrich Richter, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 267 days.

(21) Appl. No.: 13/744,638

(22) Filed: Jan. 18, 2013

(65) Prior Publication Data
US 2013/0134890 A1  May 30, 2013

Related U.S. Application Data

(63) Continuation of application No. PCT/EP2011/059812, filed on Jun. 14, 2011.

(30) Foreign Application Priority Data

Jul. 20, 2010 (DE) .......................... 10 2010 031 568

(51) Int. Cl.
*H05B 37/02* (2006.01)
*H01J 37/32* (2006.01)
(52) U.S. Cl.
CPC ..... *H01J 37/32064* (2013.01); *H01J 37/32018* (2013.01); *H01J 37/32045* (2013.01); *H01J 37/32935* (2013.01)
(58) Field of Classification Search
CPC .................. H01J 37/32091; H01J 2237/0206; H01J 37/32082; H01J 37/32036; H01J 37/32045; H01J 37/32064; H01M 10/42; H01M 10/425; H01M 10/44; H05B 31/26; H05B 37/02; H05B 33/0815
USPC ......... 323/266, 273, 282, 234, 274–276, 284, 323/285; 315/111.21, 111.51, 111.71, 291, 315/307; 118/723 R, 723 E; 156/345.28, 156/345.43, 345.44

See application file for complete search history.

(56) References Cited

U.S. PATENT DOCUMENTS 4,555,647 A * 11/1985 Leskovec et al. ............. 315/179
4,733,137 A    3/1988 Dunham (Continued)

FOREIGN PATENT DOCUMENTS

DE    3538494 A1    5/1987
DE    4127505 A1    2/1993

(Continued)

OTHER PUBLICATIONS

International Search Report from corresponding PCT Application No. PCT/EP2011/059812, mailed Sep. 27, 2011, 6 pages.

(Continued)

*Primary Examiner* — Haissa Philogene
(74) *Attorney, Agent, or Firm* — Fish & Richardson P.C.

(57) ABSTRACT

In a method for extinguishing an arc in a gas discharge chamber in which power is supplied to a gas discharge chamber and in which both with a current flow in a first direction and with a current flow in a second inverse direction there is produced a gas discharge, when an arc is identified, the power supply to the gas discharge chamber is interrupted, and residual energy which is in a supply line to the gas discharge chamber and/or in the gas discharge chamber is supplied to an energy store.

26 Claims, 4 Drawing Sheets

(56) References Cited

U.S. PATENT DOCUMENTS

| | | | |
|---|---|---|---|
| 4,792,730 A | 12/1988 | Mintchev et al. | |
| 4,936,960 A | 6/1990 | Siefkes et al. | |
| 5,241,152 A | 8/1993 | Anderson et al. | |
| 5,281,321 A | 1/1994 | Sturmer et al. | |
| 5,286,360 A | 2/1994 | Szczyrbowski et al. | |
| 5,415,757 A | 5/1995 | Szcyrbowski et al. | |
| 5,611,899 A | 3/1997 | Maass | |
| 5,815,388 A | 9/1998 | Manley et al. | |
| 5,855,745 A * | 1/1999 | Manley | 204/192.12 |
| 5,882,492 A * | 3/1999 | Manley et al. | 204/298.08 |
| 6,005,218 A | 12/1999 | Walde et al. | |
| 6,416,638 B1 | 7/2002 | Kuriyama et al. | |
| 6,440,281 B1 | 8/2002 | Stuermer et al. | |
| 6,521,099 B1 | 2/2003 | Drummond et al. | |
| 6,524,455 B1 | 2/2003 | Sellers | |
| 6,621,674 B1 | 9/2003 | Zahringer et al. | |
| 6,760,234 B2 | 7/2004 | Yuzurihara et al. | |
| 6,808,607 B2 | 10/2004 | Christie | |
| 6,815,909 B2 | 11/2004 | Mueller | |
| 6,876,205 B2 | 4/2005 | Walde et al. | |
| 6,943,317 B1 | 9/2005 | Ilic et al. | |
| 6,967,305 B2 | 11/2005 | Sellers | |
| 7,081,598 B2 | 7/2006 | Ilic et al. | |
| 7,292,045 B2 | 11/2007 | Anwar et al. | |
| 7,445,695 B2 | 11/2008 | Ilic et al. | |
| 7,514,377 B2 | 4/2009 | Sato et al. | |
| 7,514,935 B2 | 4/2009 | Pankratz | |
| 7,531,070 B2 | 5/2009 | Kuriyama et al. | |
| 7,586,210 B2 | 9/2009 | Wiedemuth et al. | |
| 7,640,120 B2 | 12/2009 | Axenbeck et al. | |
| 7,898,238 B2 | 3/2011 | Wiedemuth et al. | |
| 8,033,246 B2 * | 10/2011 | Wiedemuth et al. | 118/723 E |
| 8,169,162 B2 | 5/2012 | Yuzurihara et al. | |
| 8,217,299 B2 | 7/2012 | Ilic et al. | |
| 8,264,237 B2 | 9/2012 | Coumou | |
| 8,395,078 B2 | 3/2013 | Ilic | |
| 8,542,471 B2 | 9/2013 | Bulliard et al. | |
| 8,552,665 B2 | 10/2013 | Larson et al. | |
| 8,734,627 B2 | 5/2014 | Matsubara et al. | |
| 8,786,263 B2 * | 7/2014 | Ozimek et al. | 323/266 |
| 2008/0061794 A1 | 3/2008 | Pankratz | |
| 2008/0135401 A1 | 6/2008 | Kadlec et al. | |
| 2008/0216745 A1 | 9/2008 | Wiedemuth et al. | |
| 2009/0160417 A1 | 6/2009 | Klimczak et al. | |
| 2009/0308734 A1 | 12/2009 | Krauss | |
| 2010/0225411 A1 | 9/2010 | Maier | |
| 2011/0120861 A1 | 5/2011 | Horishita et al. | |

FOREIGN PATENT DOCUMENTS

| | | |
|---|---|---|
| DE | 4230779 A1 | 3/1994 |
| DE | 4239218 A1 | 5/1994 |
| DE | 102006043900 A1 | 4/2008 |
| DE | 102009025422 A1 | 10/2010 |
| EP | 1720195 A1 | 11/2006 |
| EP | 1995818 A1 | 11/2008 |
| EP | 2026375 A2 | 2/2009 |
| EP | 2156505 B1 | 4/2011 |
| EP | 2402980 A2 | 1/2012 |
| JP | 04100938 U | 9/1992 |
| JP | 2733454 B2 | 12/1997 |
| JP | 2002235170 A | 8/2002 |
| JP | 2003268541 A | 9/2003 |
| JP | 2004183012 A | 7/2004 |
| JP | 2004194420 A | 7/2004 |
| JP | 2004225100 A | 8/2004 |
| JP | 2004323902 A | 11/2004 |
| JP | 2004327193 A | 11/2004 |
| JP | 2006274393 A | 10/2006 |
| JP | 2007169710 A | 7/2007 |
| JP | 2008123772 A | 5/2008 |
| JP | 2009059714 A | 3/2009 |
| JP | 2010251161 A | 11/2010 |
| JP | 2011222292 A | 11/2011 |
| JP | 5284396 B2 | 6/2013 |
| KR | 100501069 B1 | 7/2005 |
| KR | 1020050071932 A | 7/2005 |
| KR | 1020110012055 A | 2/2011 |
| KR | 1020120113848 A | 10/2012 |
| KR | 1020120133503 A | 12/2012 |
| WO | WO2007080905 A1 | 7/2007 |
| WO | 2008138573 A1 | 11/2008 |
| WO | WO2009012966 A1 | 1/2009 |
| WO | WO2009145092 A1 | 12/2009 |
| WO | WO2010100835 A1 | 9/2010 |

OTHER PUBLICATIONS

Notification of Transmittal of the Translation of the International Preliminary Report on Patentability for PCT Application No. PCT/EP2011/059812, mailed Jan. 31, 2013, 8 pages.

Anderson et al., "A New Technique for Arc Control in DC Sputtering", Society of Vacuum Coaters, 35th Annual Technical Conference Proceedings, pp. 325-329, 1992.

Lach et al., "DC Sputtering for Frequently Arcing Processes", Society of Vacuum Coaters, 53rd Annual Technical Conference Proceedings, pp. 98-100, 2010.

Milde et al., "Experience with High Power DC Supplies with Fast Arc Suppression in Large Area Coating", Society of Vacuum Coaters, 44th Annual Technical Conference Proceedings, pp. 375-381, 2001.

Ozimek et al., "HIPIMS Power Supply Requirements: Parameters and Breakthrough Arc Management Solution", 52nd Annual Technical Conference Proceedings, pp. 285-289, 2009.

Rettich et al., "Arc Management in DC and MF Generators for Large Area Coating Systems", Society of Vacuum Coaters, 47th Annual Technical Conference Proceedings, pp. 237-240, 2004.

Semikron, "Trench IGBT Modules Preliminary Data", 1 page, 2007.

* cited by examiner

ARC EXTINCTION ARRANGEMENT AND METHOD FOR EXTINGUISHING ARCS

CROSS REFERENCE TO RELATED APPLICATIONS

This application is a continuation of and claims priority under 35 U.S.C. §120 to PCT Application No. PCT/EP2011/059812 filed on Jun. 14, 2011, which claimed priority to German Application No. 10 2010 031 568.0, filed on Jul. 20, 2010. The contents of both of these priority applications are hereby incorporated by reference in their entirety.

TECHNICAL FIELD

This specification relates to a method for extinguishing an arc in a gas discharge chamber.

BACKGROUND

Vacuum plasma generators are known in various power classes and with various output signal forms.

In vacuum glass coating, for example, medium frequency (MF) generators having an MF output signal with powers between 30 and 300 kW are used. The MF signal is mostly a sinusoidal signal with frequencies between 10 kHz and 200 kHz. The output voltages may be from several 100 V to over 1000 V. In order to ignite the plasma, the voltages are often very much higher than during normal operation.

In the plasma, brief and also longer-lasting flashovers may occur, so-called arcs, which are undesirable. An arc is generally identified by means of a collapse or decrease of the voltage and an increase of the current, in particular at the output of the generator or at another location in the generator. If such an arc is identified, it must be ensured that it is extinguished as quickly as possible or does not develop completely.

EP 1 720 195 A1 discloses an arc extinction arrangement in a gas discharging device which is operated with alternating current voltage, in particular MF alternating current voltage, having an arc extinguishing device and an arc identification device which controls it, the arc extinction device having at least one controllable resistor which is arranged in series connection in an electrical line which extends from an alternating current voltage source to an electrode of the gas discharging device. As a controllable resistor, a switch, in particular an IGBT, is provided. When an arc is identified, the switches are switched into a conductive state in such a manner that electrical energy is deliberately converted into heat therein. The depletion layer is greatly heated in the IGBT so that only a few arcs can consequently be processed without leading to destruction of the IGBT.

SUMMARY

It is useful, therefore, to provide a method for extinguishing an arc and an arc extinction device which can also be used at high arc rates. This specification relates to a method for extinguishing an arc in a gas discharge chamber in which power is supplied to a gas discharge chamber in which both with a current flow in a first direction and with a current flow in a second inverse direction there is produced a gas discharge, in which upon detection of an arc the power supply to the gas discharge chamber is interrupted. Furthermore, the specification describes an arc extinction arrangement which comprises at least partially a supply line between a power supply and an electrode of a gas discharge chamber, there being able to be produced in the gas discharge chamber both with a current flow in a first direction and a current flow in a second inverse direction a gas discharge, with an arc extinction device.

As described herein, there is provision, when an arc is identified, for residual energy which is in a supply line to the gas discharge chamber and/or in the gas discharge chamber to be supplied to an energy store. In this manner, the residual energy for the plasma process can be significantly reduced. As described, very quick, efficient arc extinction can be carried out. The arc energy can be very powerfully and quickly reduced. Furthermore, as described, components in the gas discharge chamber but also in the control unit for the electrodes of the gas discharge chamber can be protected.

In an alternative embodiment of the method, when an arc is identified, the power supply to the gas discharge chamber can be interrupted by opening at least one switch and the voltage across the switch can be limited to a voltage of an energy store. Residual energy which is in a supply line to the gas discharge chamber and/or in the gas discharge chamber can be supplied to the energy store. In addition, residual energy which is still in leakage inductances of an output transformer or an inductor of an output oscillating circuit can also be supplied to the energy store. In this manner, this energy is prevented from being supplied to the arc.

Owing to non-linear components, the return flow of energy from the energy store into the supply line to the gas discharge chamber and/or in the gas discharge chamber can be reduced or prevented. This leads to a very quick extinction of an arc with extremely low residual energy in the gas discharge chamber. The arc energy can be reduced quickly and efficiently.

The extent of the destruction in the gas discharge chamber can thereby be reduced. The power loss in switches can be reduced so that the method can also be used with high arc rates, for example, >2 kHz.

The energy store can be precharged to a predetermined storage state during arc-free operation, that is to say, during normal operation. The arc extinction can thereby be accelerated.

There may further be provision for the energy store to be discharged to a predetermined storage state after successful arc extinction. It is consequently ensured that the energy store can again receive sufficient residual energy when the next arc occurs. At the beginning of the arc processing, there is always therefore the same initial state. Furthermore, the energy store can thereby be protected from destruction.

There may be provision for both residual energy caused by current flow in the first direction and residual energy caused by current flow in the second direction to be supplied exclusively to one (the same) energy store, e.g., a single capacitor or battery. It is then not necessary to provide two different energy stores for different current directions. This leads to a more simple structure of the circuit, the reduction of expensive components and enables more simple precharging and discharging of the energy store.

By the residual energy being supplied to the energy store, a voltage reversal can be produced in the supply lines, in particular the line inductors of the supply lines. This results in more rapid arc extinction.

The switching of the supply of the power towards the gas discharge in order to interrupt this supply and supplying the residual energy to the energy store can be carried out by means of only one control signal by two electronic switches being controlled at the same time with the control signal, and in particular opened.

The switches may be constructed as IGBT, MOSFET or other electronic switches.

The two switches may be constructed identically. This results in a more simple structure of the circuit by means of which the method is implemented. Expensive components may be reduced. The operation and monitoring are simplified.

During the supply of the power to the gas discharge chamber, the two electronic switches may be closed and, when an arc is identified, these switches may be opened. This leads to a reduction of the power loss in the switches. Consequently, the method can also be used at high arc rates (>2 kHz).

During the supply of the power to the gas discharge, at least one switch may be closed and, when an arc is identified, this switch may be opened. The power loss in the switches is thereby reduced.

The arc extinction arrangement can have an arc extinction device having an energy store for receiving energy which is in a supply line to the gas discharge chamber and/or in the gas discharge chamber. This enables very rapid, efficient arc extinction. The arc energy is reduced and components in the gas discharge chamber are protected.

With such an arrangement, residual energy which is still in leakage inductances of an output transformer of an output oscillating circuit may also be supplied to the energy store. In this manner, this energy is prevented from being supplied to the arc.

The gas discharge in the gas discharge chamber is produced both with a current flow in a first direction and with a current flow in a reverse direction. An arc may be produced in the gas discharge chamber. Owing to the provision of an energy store, the arc can be prevented from being supplied with further energy. In particular, arc energy can also be redirected from the gas discharge chamber and be supplied to the energy store.

The arc extinction device may have non-linear components which are arranged in such a manner that a power flow from the energy store into the supply lines and the gas discharge chamber is reduced or prevented. There may in particular be provision for the arc extinction device to have at least one switch which is arranged in series connection in a supply line which extends from the energy supply device to one of the electrodes of the gas discharge chamber and which can be opened by being controlled by means of a control signal when an arc is identified. A simple structure of the circuit is thereby achieved. Losses in the switch can be reduced. It is thereby possible to react to an increased arc frequency.

There may be provided an arc detection device which is connected to the arc extinction device having a control circuit which is connected to the switch. It is thereby possible to adjust the arc duration, an arc reaction threshold and a delay time until reaction to an arc. The control circuit can also be used for periodic or aperiodic pulsing, for example, for prophylactic arc prevention.

The energy store may comprise a capacitor. The residual energy which is stored, for example, in inductors of the supply line, can most rapidly be transferred to another energy store when the energy store is a capacitor. There are preferably further provided diodes by means of which the return flow of energy into the supply line can be prevented in a very simple manner.

Often the majority of the residual energy is stored in the inductors of the supply lines and/or the output oscillating circuit. It is then particularly advantageous if this residual energy is transferred to a capacitor. For arrangements in which a majority of the residual energy is stored in capacitors, for example, the supply lines and/or the gas discharge chamber, the energy store may be an inductor.

A direct current voltage source may be provided in order to precharge the energy store. A direct current voltage may be provided in a simple manner. It can very simply be provided in a manner galvanically separated from an earth potential, which is advantageous in this instance. It may readily be adjusted very rapidly where applicable and adapted to the often different gas discharge processes with different arc behavior. A node point of a supply line may be connected by means of a rectifying element, in particular a diode, to the capacitor of the energy store in order to precharge the energy store. With a circuit which is configured in this manner, the energy store, in particular a capacitor, can be simply precharged. Furthermore, no additional galvanically separated voltage supply is required. The voltage of the capacitor is thereby adapted to the voltage of the plasma process.

A direct current voltage controller may be arranged downstream of the rectifying element.

The arc extinction device may be constructed in a symmetrical manner, there being provided two diodes which are arranged in series and two switch devices, and the energy store being connected between the connection point of the diodes and the connection point of the switch arrangements. There is thereby produced a simple, rapid circuit with a minimal number of active components. If more active components were required, the speed of the arc reaction would be reduced.

The switch arrangements may each have at least one IGBT to which an antiparallel diode is connected in parallel between the collector and emitter. This enables the use of standardized components, which are widely used in electronic power systems and which are consequently available in a reliable and cost-effective manner.

There may be provided modules which have the switches and diodes. Components can thereby be reduced and interruption-free wiring can be ensured. The reliability of the entire circuit may thereby be improved.

There may further be provided a direct current voltage source with galvanic separation with respect to an earth potential in order to precharge the energy store. A direct current voltage can very easily be provided. Furthermore, it can simply be provided in a manner galvanically separated from an earth potential, which is advantageous in this instance. It may also be very rapidly adjusted in a simple manner where applicable, and adapted to different gas discharge processes.

There may be provision for the arc extinction arrangement to have no galvanic connection to an earth potential. The reliability of the arc extinction arrangement is thereby improved since it is itself independent of malfunctions on lines with respect to the earth potential or malfunctions on earth connections.

The switches may be closed during plasma operation and be opened in the event of arc extinction. Losses in the switch are thereby reduced and it is possible to react to increased arc rates.

In addition, a discharging device for discharging the energy store may be provided. The energy store can thereby be discharged as far as a predetermined storage state. It can consequently be ensured that the energy store always has the same initial state if residual energy has to be received.

There may be provided a voltage monitoring system which activates the discharging device for discharging the energy store when a predetermined voltage value has been exceeded. The energy store can thereby be protected from excess voltages.

There may further be provided a voltage monitoring system which deactivates the discharging device for discharging the energy store when a value falls below a predetermined voltage value. The voltage at the energy store can thereby be adjusted in a simple manner. Predeterminable values for arc extinction can consequently be adjusted.

There may be provided a current monitoring system which activates the discharging device for discharging the energy store when a predetermined current value has been exceeded. The energy store can thereby be protected from excess current.

There may further be provided a current monitoring system which deactivates the discharging device for discharging the energy store when a value falls below a predetermined current value. The current at the energy store can thereby be adjusted in a simple manner. Predeterminable values for arc extinction can consequently be adjusted.

The energy removed from the energy store can be converted into heat in the discharging device. Simple and cost-effective energy conversion can thereby be carried out at low arc rates. Energy removed can be at least partially returned to the energy store by means of an energy conversion device of the power supply system connected downstream of the discharging device. Although such an embodiment is slightly more complex, it is energy-saving and space-saving, at least with applications with a high arc rate, in which the conversion of the energy into heat often requires a very large amount of space, since the heat conversion must be distributed over a large surface-area.

At the switches, a voltage limitation circuit may be provided. It can thereby be ensured that the switches operate to the greatest possible extent in switching mode and the energy is not converted into heat in the switches, but instead is transferred to the energy store. Nonetheless, the switches must be protected from excess voltage.

Other features and advantages of the invention will be appreciated from the following description of embodiments of the invention, with reference to the Figures of the drawings which show inventively significant details, and from the claims. The individual features may each be implemented individually or together in any combination in a variant of the invention. Preferred embodiments of the invention are schematically illustrated in the drawings and are explained in greater detail below with reference to the Figures of the drawings.

DETAILED DESCRIPTION

Figure 1A:
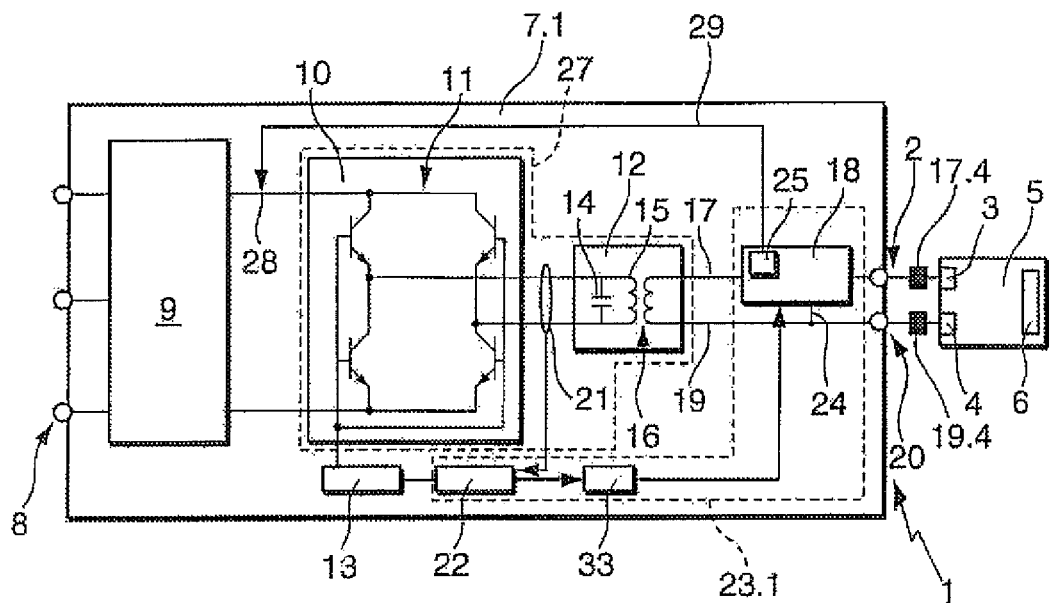
FIG. 1a shows a first embodiment of an alternating current voltage gas discharge excitation arrangement which is connected to a gas discharge chamber.

FIG. 1a illustrates an alternating current voltage gas discharge excitation arrangement 1 which is connected by means of supply lines 2 to electrodes 3, 4 of a gas discharge chamber 5, in particular a plasma installation. The electrodes 3, 4 are arranged in the gas discharge chamber 5 in which a workpiece 6 is processed.

The alternating current voltage gas discharge excitation arrangement 1 comprises an alternating current voltage generator 7.1 which has a mains connection 8 which may be single-phase or multi-phase. There is connected to the mains connection 8 a mains rectifier 9 which may have other components, such as, for example, a DC/DC converter. At the output thereof is a so-called intermediate circuit direct current voltage. There is connected downstream of the mains rectifier 9 a voltage converter 10 which comprises a bridge circuit 11. An output oscillating circuit 12 is controlled by the voltage converter 10. The output signal of the voltage converter 10 is adjusted by means of a voltage converter control system 13 which controls the voltage converter 10. The voltage converter 10 and the output oscillating circuit 12 may be considered to be a power supply 27, in particular an alternating current voltage or alternating current source. The output oscillating circuit 12 may, as illustrated in this instance, be a parallel resonance circuit or be configured as a series resonance circuit.

The output oscillating circuit 12 comprises a capacitor 14 and the leakage inductance 15 of an output transformer 16. Owing to the output transformer 16, a galvanic separation can be carried out. Furthermore, it can be used for voltage adjustment. In order to be able to adjust the resonance frequency in an optimum manner, the capacitor 14 may be adjustable. In the supply line 17 which extends to the electrode 3 of the gas discharge chamber 5, an arc extinction device 18 is arranged in series. Between the supply lines 17, 19 and at the output connection 20 of the alternating current voltage generator 7.1 in normal operation there is a medium frequency (MF) alternating current voltage with frequencies of from 5 kHz to 500 kHz.

If an arc occurs in the gas discharge chamber 5, this acts on the current and/or voltage and/or power in the alternating current voltage generator 7.1. One or more of these variables may, for example, be measured by means of a measuring device 21 which is arranged between the voltage converter 10 and output oscillating circuit 12. The measuring device 21 could, however, also be arranged at another location in the alternating current voltage generator 7.1 or even at the gas discharge chamber side.

Owing to the variable(s) measured by the measuring device 21, an arc detection device 22 can determine whether an arc has occurred or is being produced. The arc detection device 22, in the same manner as the arc extinction device 18 is part of an arc extinction arrangement 23.1. The arc detection device 22 is further connected to the voltage converter control system 13. It can influence this in such a manner that, when an arc is detected, the bridge circuit 11 is controlled in such a manner that no further energy flows from the voltage converter 10 in the direction of the output oscillating circuit 12. The arc extinction device 18 has an energy store to which residual energy, for example, from (line) inductors 17.1, 19.1, 17.4, 19.4 or the gas discharge chamber 5 is supplied when an arc occurs. The inductors 17.1, 19.1 may also constitute or contain portions of leakage inductances of the output transformer 16. The inductors 17.4 and 19.4 substantially constitute the supply line inductors which the supply lines 2 from the alternating current voltage generator 7.1 to the electrodes 3, 4 of a gas discharge chamber 5 have.

Optionally, the supply line 19 may also be connected to the arc extinction device 18 which is indicated with the reference numeral 24.

Optionally, the arc extinction device 18 may have an energy conversion device 25 which converts the energy supplied in the energy store into direct current voltage power and supplies it to a direct current voltage supply point 28 in the alternating current voltage generator 7.1 via a connection 29. The direct current voltage supply point 28 may be, for example, the intermediate current direct current voltage.

Figure 1B:
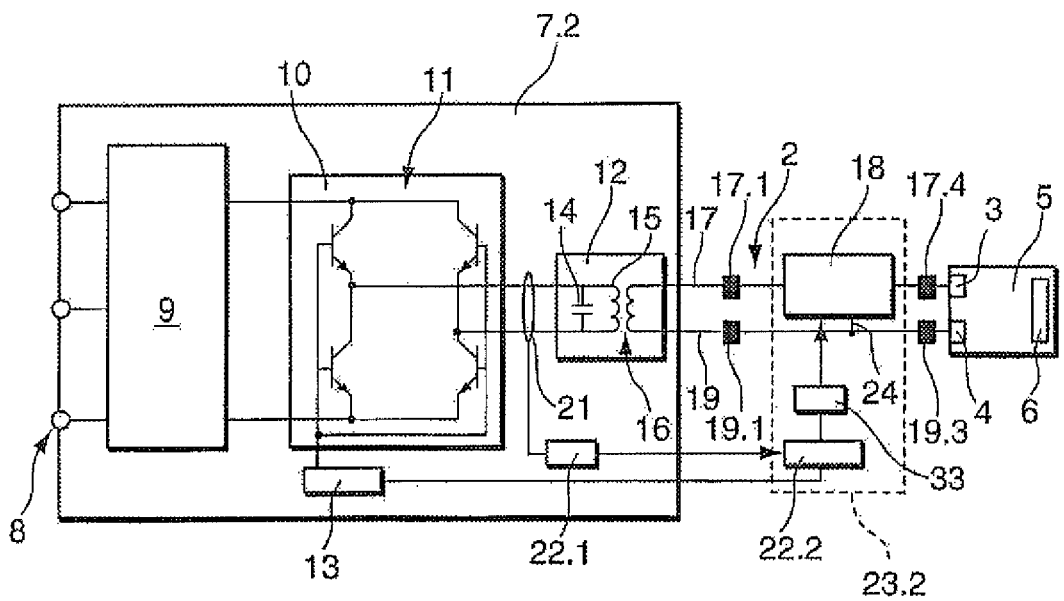
FIG. 1b shows an alternative embodiment of the alternating current voltage gas discharge excitation arrangement.

FIG. 1b substantially corresponds to FIG. 1a with the difference that the arc extinction arrangement 23.2 is arranged outside the alternating current voltage generator 7.2. This means that the arc extinction device 18 is arranged in one of the supply lines 2 to the gas discharge chamber 5. In this instance, an arc detection device 22.1 may be arranged in the alternating current voltage generator 7.2 and/or an arc detection device 22.2 in the arc extinction arrangement 23.2.

Figure 2:
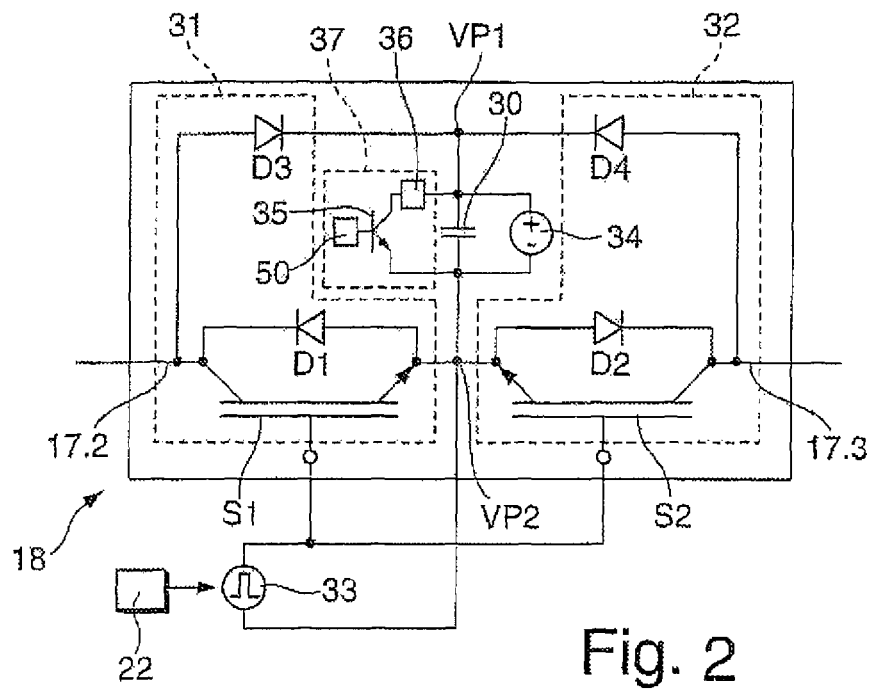
FIG. 2 shows an embodiment of an arc extinction device.

FIG. 2 shows a first embodiment of a symmetrically constructed arc extinction device 18. The arc extinction device 18 has supply line portions 17.2, 17.3. An energy store 30 is constructed in the embodiment as a capacitor. The energy store 30 is connected to the supply line portion 17.2 by means of a switch S1 which is constructed as an IGBT and a diode D1 which is arranged in an anti-parallel manner relative thereto. It is further connected to the supply line portion 17.3 by means of the switch S2 which is constructed as an IGBT and the diode D2 which is arranged in an anti-parallel manner relative thereto. The other connection of the energy store 30 is connected on the one hand via the diode D3 to the supply line portion 17.2 and via the diode D4 to the supply line portion 17.3. The components S1, D1 and D3 may be arranged in a prefabricated module 31 and the components S2, D2 and D4 in a prefabricated module 32. The diodes D3, D4 are connected in series. The switch S1 forms a switch arrangement with the diode D1 and the switch S2 forms a switch arrangement with the diode D2. The energy store 30 is connected between the connection point VP1 of the diodes D3, D4 and the connection point VP2 of the switch arrangements. The cathodes of the diodes D3, D4 are connected to the connection point VP1. The anode of the diode D3 is connected to the supply line portion 17.2. The anode of the diode D4 is connected to the supply line portion 17.3.

In the case of arc detection, the switches S1, S2 which are closed during normal operation are opened. A current thereby no longer flows via the diodes D1, D2 and switches S1, S2, but instead via the diodes D3, D4 to the diodes D2, D1. Energy in the supply lines 17, 19 and in the gas discharge chamber 5 is charged to the energy store 30. Owing to the switching state of the switches S1, S2, which constitute the non-linear components, and the arrangement of the diodes D1-D4, a return flow of energy from the energy store 30 into the supply lines 17, 19 and in particular the gas discharge chamber 5 is prevented. In this instance, there are required only two structurally identical modules 31, 32 which each have a switch S1 and S2 and two diodes D1, D3 and D2, D4, respectively. The transfer of energy into the energy store 30 functions regardless of which semi-wave of the alternating current voltage is currently present at the gas discharge chamber 5 or independently of the direction of the current flow in the gas discharge chamber 5.

A control circuit 33 for controlling the switches S1, S2 may be connected to the arc detection device 22 or be part thereof. Parallel with the energy store 30, a galvanically separated direct current voltage or direct current source 34 is provided in order to be able to precharge the energy store 30. There is further provided parallel with the energy store 30 a discharging device 37 which has a switch 35 and a resistor 36 and by means of which the energy store 30 can be discharged. A voltage monitoring system 50 monitors the charging state of the energy store 30 and activates the discharging device 37 when a predetermined voltage value is exceeded or deactivates it when a value falls below a voltage value.

Figure 3:
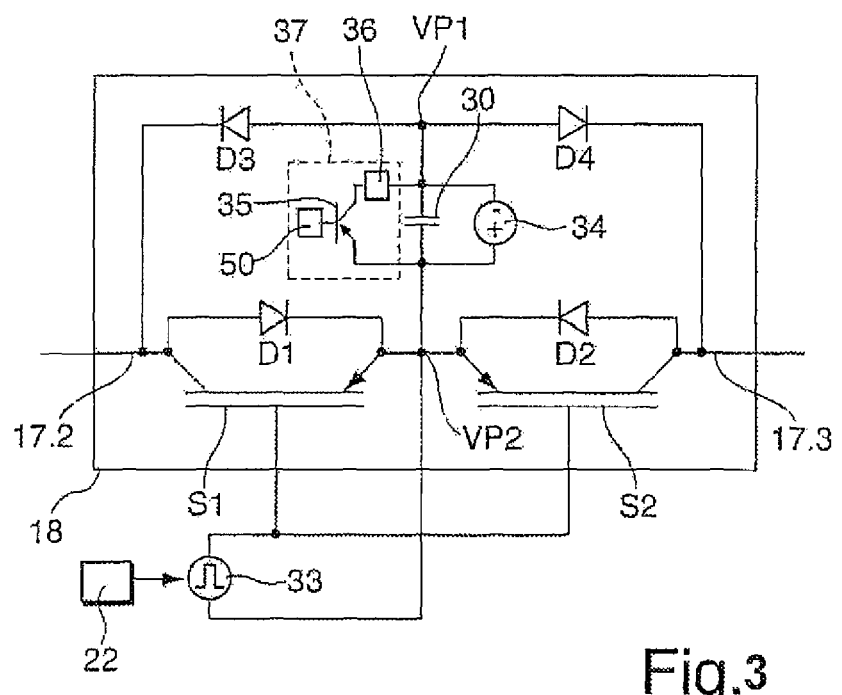
FIG. 3 shows a second embodiment of an arc extinction device.

FIG. 3 shows an alternative embodiment of an arc extinction device 18.1. The difference with respect to FIG. 2 is that the components S1, S2, D1, D2 and D3, D4 are installed in a reverse orientation.

Figure 4:
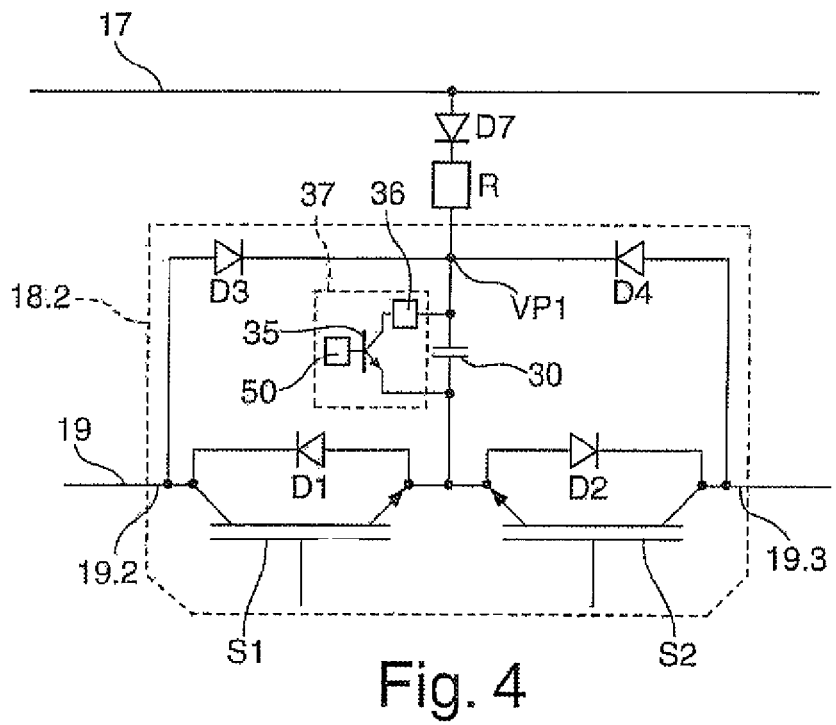
FIG. 4 shows a third embodiment of an arc extinction device.

FIG. 4 shows an embodiment in which an arc extinction device 18.2 is arranged in the supply line 19 and which further has a connection to the supply line 17. The arc extinction device 18.2 has supply line portions 19.2, 19.3. In contrast to the arc extinction device 18, the arc extinction device 18.2 has no direct current voltage or direct current source 34. The energy store 30 is instead connected to the supply line 17 by means of a diode D7 and a resistor R. In addition to the resistor R, a voltage or current controller or a combination of both may be used. The advantage of the arc extinction device 18.2 is that no additional galvanically separated voltage supply is required to charge the energy store. Furthermore, the voltage of the energy store 30 is adapted to the voltage of the plasma process. If this is not desired, a voltage and/or current control circuit could be used for current limitation in place of the resistor R. In this instance, no galvanic separation is required.

Figure 5:
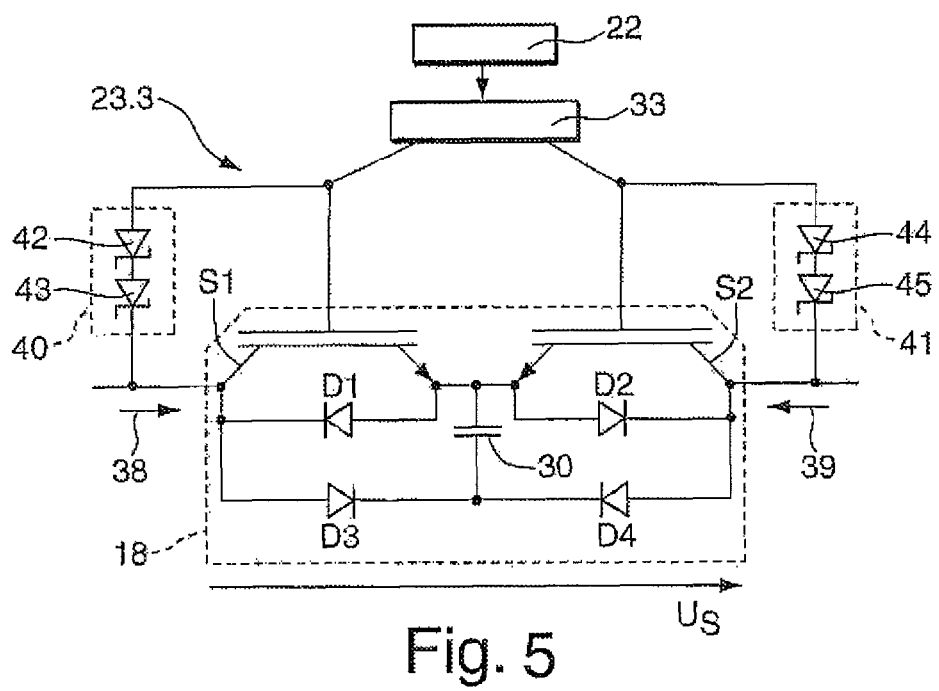
FIG. 5 shows an arc extinction arrangement with a voltage limitation circuit.

FIG. 5 illustrates an embodiment of an arc extinction arrangement 23.3 which can be used both as an arc extinction arrangement 23.1 in the arrangement of FIG. 1 and as an arc extinction arrangement 23.2 in the arrangement of FIG. 2. The arc extinction arrangement 23.3 comprises two switches S1, S2 which are connected in series and connected in a mutually opposing manner, and which are constructed as IGBTs. A diode D1, D2 is connected in each case parallel with the switches S1, S2, the diodes D1, D2 being arranged with a forward direction which is opposed to the respective switch S1, S2. The switches S1, S2 are controlled by the arc identification device 22.

FIG. 5 also shows for each switch S1, S2 a voltage limitation circuit 40 and 41 which each comprise two Z diodes 42, 43, 44, 45. During normal operation, the switches S1, S2 are switched into the conductive state. This means that a current flow is carried out in the direction of the arrow 38 via the switch S1 and the diode D2 and a current flow is carried out in the direction of the arrow 39 via the switch S2 and the diode D1.

If an arc is detected, the arc identification system 22 controls the switches S1, S2 in such a manner that they open. A current flow through the switches S1, S2 is thereby possible neither in the direction of the arrow 38 nor in the direction of the arrow 39. However, as soon as the voltage limitation circuit 41 determines a voltage which exceeds a predetermined value, the switches S1, S2 are again switched into the conductive state. This serves to protect the switches from excess voltage which destroys them. Generally, the voltage at the switches is limited by the voltage across the capacitor 30 and the Z diodes 42, 43, 44, 45 are selected in such a manner that the voltage limitation circuits 40, 41 do not become active. However, since inherent inductances are present in the circuit and depletion layers of diodes become charged in forward operation with charge carriers which are discharged again in reverse operation, very high temporary voltage peaks may occur which could destroy the switches. For this reason, the voltage limitation circuits 40, 41 are provided. The switches S1, S2 are operated to the greatest possible extent in switching operation so that the smallest possible amount of energy is converted into heat, but instead the largest possible amount of energy is transferred to the energy store 30.

Figure 6:
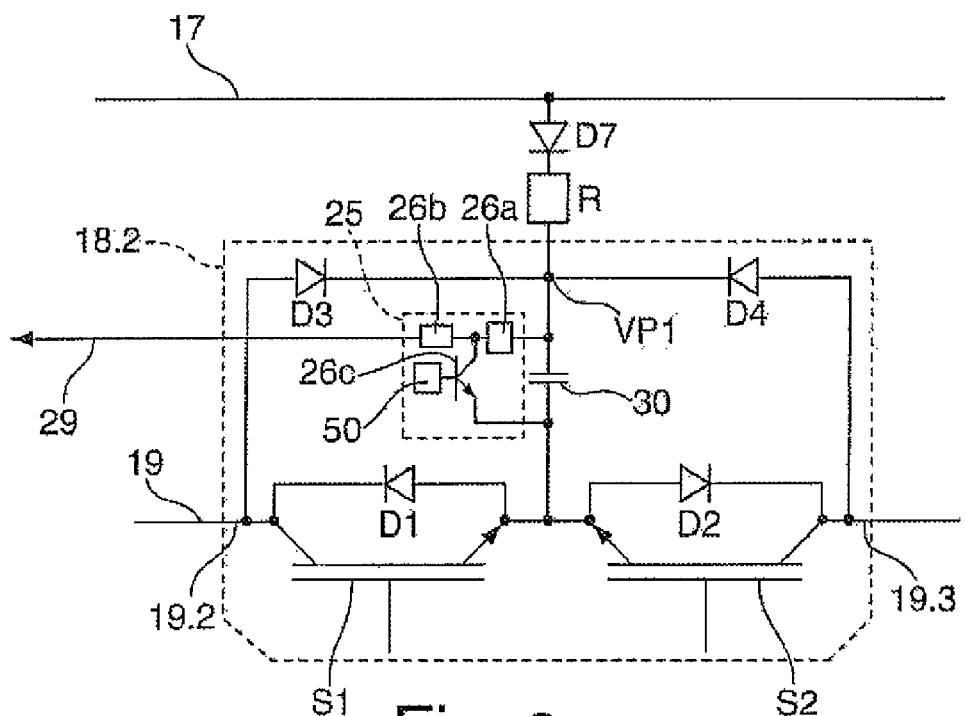
FIG. 6 shows an arc extinction arrangement with energy conversion device.

FIG. 6 shows the circuit of FIG. 4. In this instance, the discharging device 37 is replaced by the energy conversion device 25 which has various components 26a, 26b, 26c which may optionally be connected together to form a step-up converter, step-down converter or other DC/DC converter with or without galvanic separation. The energy conversion device 5, in contrast to the discharging device 37, may convert the energy not only completely into heat, but also supply it again to at least one other portion of the power supply system 27 or another energy consumer. To this end, it can produce a controlled direct current voltage or a controlled direct current. A conversion into alternating current voltage or alternating current is also conceivable. A direct current can be supplied via the connection 29 to an intermediate circuit direct current voltage of the alternating current voltage generator 7.1.

Figure 7:
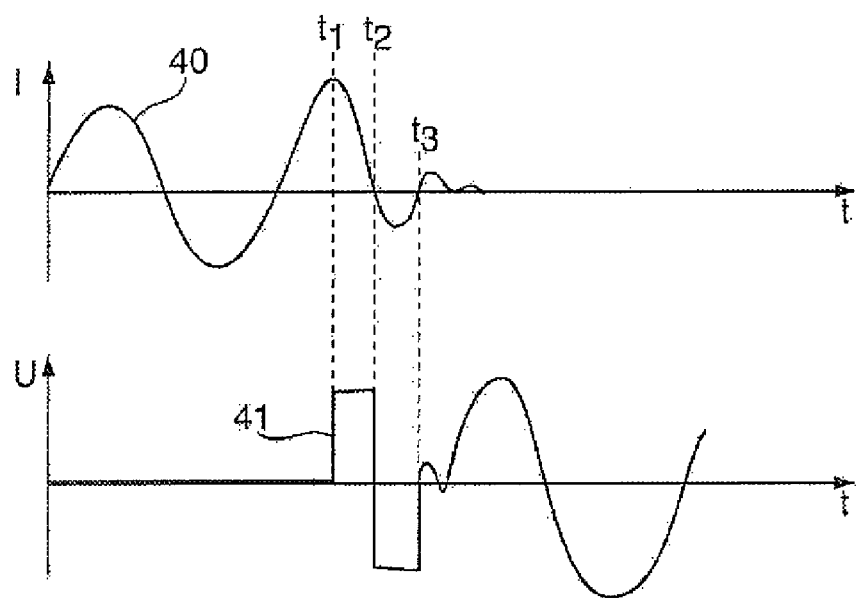
FIG. 7 shows a time path of current and voltage on the arc extinction device.

FIG. 7 shows the current path 40 and voltage path 41 at the arc extinction device 18, 18.1, 18.2. The current path 40 shows the time path of a current as it flows into or out of the arc extinction device 18, 18.1, 18.2. For example, the current path 40 may be a current in the direction of the arrow 38 or 39 in FIG. 5. For the following description, a current path 40 in the direction of the arrow 38 is assumed. The voltage path 41 then corresponds to the voltage path of the voltage Us across the switches S1, S2 in FIG. 5. At the time t1, the switches S1, S2 are opened and the current flow is prevented by these switches. A current in the direction of the arrow 38 will now flow further via the diodes D3, D2 and the energy store 30. At D3, D2, in comparison with the voltage at the energy store 30, only a negligibly small voltage decreases. Residual energy which is in a supply line 17, 19 to the gas discharge chamber 5 and/or in the gas discharge chamber 5 and/or in inductors of the output oscillating circuit 12 is supplied to the energy store 30 which is charged again therewith. The voltage may consequently slightly increase. The current rapidly decreases owing to the voltage present. At the time t2, it changes direction and now flows through the diodes D4, D1. The voltage Us at the switch S1, S2 is reversed and further brakes the current which is flowing in the opposite direction. At the time t3, the current changes direction again but has now dropped to a negligibly low level. If the switches remain open as in the example shown, the alternating current voltage caused by the power supply 27 now decreases at that location.

A number of embodiments of the invention have been described. Nevertheless, it will be understood that various modifications may be made without departing from the spirit and scope of the invention. Accordingly, other embodiments are within the scope of the following claims.

What is claimed is:

1. A method for extinguishing an arc in a gas discharge chamber in which power is supplied to the gas discharge chamber by a first current flow in a first direction and a second current flow in a second inverse direction, thereby producing a gas discharge, the method comprising:
   upon detection of the arc, interrupting the power supply to the gas discharge chamber; and
   storing, in an energy store, residual energy supplied from a supply line to the gas discharge chamber, or supplied from the gas discharge chamber, or both.

2. The method of claim 1, further comprising reducing or preventing, by a plurality of non-linear components, a return flow of energy from the energy store into the supply line to the gas discharge chamber or the gas discharge chamber or both.

3. The method of claim 1, further comprising pre-charging the energy store to a predetermined storage state during arc-free operation.

4. The method of claim 1, further comprising discharging the energy store to a predetermined storage state after successful arc extinction.

5. The method of claim 1, wherein both residual energy caused by the first current flow in the first direction and residual energy caused by the second current flow in the second direction is supplied exclusively to the energy store.

6. The method of claim 1, wherein, by the residual energy being supplied to the energy store, a voltage reversal is produced in the supply lines.

7. The method of claim 1, wherein the first direction of the first current flow is from the supply line to an electrode of the gas discharge chamber and the second direction of the second current flow is from the electrode to the supply line.

8. The method of claim 1, wherein the energy store is included in an arc extinction device constructed in a symmetrical manner, wherein the arc extinction device comprises two diodes arranged in series and two switch arrangements, and wherein the energy store is connected between a connection point of the diodes and a connection point of the switch arrangements.

9. The method of claim 8, wherein a first switch arrangement of the switch arrangements comprises a first switch and a first diode arranged in an anti-parallel manner relative to the first switch and a second switch arrangement of the switch arrangements comprises a second switch and a second diode arranged in an anti-parallel manner relative to the second switch,
   wherein, upon detection of the arc, the first and second switches that are closed during normal operation are opened, and
   wherein the residual energy caused by the first current flow in the first direction is supplied to the energy store via a third diode of the two diodes arranged in series and one of the first diode and the second diode, and the residual energy caused by the second current flow in the second direction is supplied to the energy store via a fourth diode of the two diodes arranged in series and the other one of the first diode and the second diode.

10. An arc extinction arrangement comprising:
   a supply line between a power supply system and an electrode of a gas discharge chamber, wherein the gas discharge chamber is configured to produce a gas discharge both with a first current flow in a first direction and with a second current flow in a second inverse direction; and
   an arc extinction device comprising an energy store for receiving energy present in the supply line or the gas discharge chamber or both.

11. The arc extinction arrangement of claim 10, wherein the arc extinction device comprises a plurality of non-linear components arranged so that a power flow from the energy store into the supply line and the gas discharge chamber or both is reduced or prevented.

12. The arc extinction arrangement of claim 10, wherein the arc extinction device comprises at least one switch which is arranged in series connection in the supply line, wherein the switch is configured to be opened by a control signal when an arc is detected.

13. The arc extinction arrangement of claim 10, wherein the energy store includes a capacitor, and wherein a node point of the supply line is connected to the capacitor of the energy store by a rectifying element configured to pre-charge the energy store.

14. The arc extinction arrangement of claim 10, comprising a direct current voltage source with galvanic separation with respect to an earth potential, wherein the direct current voltage source is configured to pre-charge the energy store.

15. The arc extinction arrangement of claim 10, wherein the arc extinction arrangement has no galvanic connection with respect to an earth potential.

16. The arc extinction arrangement of claim 10, comprising a discharging device configured to discharge the energy store.

17. The arc extinction arrangement of claim 16, comprising a voltage monitoring system configured to deactivate the discharging device when a value falls below a predetermined voltage value.

18. The arc extinction arrangement of claim 10, comprising an energy conversion device connected to the energy store, wherein the energy conversion system is configured to remove energy from the energy store and return, at least partially, the removed energy to the power supply system.

19. The arc extinction arrangement of claim 10, wherein the first direction of the first current flow is from the supply line to the electrode and the second direction of the second current flow is from the electrode to the supply line.

20. An arc extinction arrangement comprising:
a supply line between a power supply system and an electrode of a gas discharge chamber, wherein the gas discharge chamber is configured to produce a gas discharge both with a first current flow in a first direction and with a second current flow in a second inverse direction; and
an arc extinction device comprising an energy store for receiving energy present in the supply line or the gas discharge chamber or both,
wherein the arc extinction device is constructed in a symmetrical manner, wherein the arc extinction device comprises two diodes which are arranged in series and two switch arrangements, and wherein the energy store is connected between a connection point of the diodes and a connection point of the switch arrangements.

21. The arc extinction arrangement of claim 20, wherein the switch arrangements each comprise at least one IGBT to which an anti-parallel diode is connected in parallel between the collector and emitter.

22. The arc extinction arrangement of claim 20, comprising two modules housing the switches and diodes.

23. A method for extinguishing an arc in a gas discharge chamber in which power is supplied to the gas discharge chamber by a first current flow in a first direction and a second current flow in a second inverse direction, thereby producing a gas discharge, the method comprising:
upon detection of an arc, interrupting the power supply to the gas discharge chamber, including opening at least one switch between a power source and the gas discharge chamber; and
limiting a voltage across the switch to a voltage of an energy store, wherein the energy store is configured to store residual energy from a supply line to the gas discharge chamber or the gas discharge chamber or both.

24. The method of claim 23, wherein the energy store is included in an arc extinction device constructed in a symmetrical manner, wherein the arc extinction device comprises two diodes arranged in series and two switch arrangements, and wherein the energy store is connected between a connection point of the diodes and a connection point of the switch arrangements.

25. The method of claim 23, further comprising reducing or preventing, by a plurality of diodes, a return flow of energy from the energy store into the supply line to the gas discharge chamber or the gas discharge chamber or both.

26. The method of claim 23, wherein the first direction of the first current flow is from the supply line to an electrode of the gas discharge chamber and the second direction of the second current flow is from the electrode to the supply line.

* * * * *